United States Patent [19]

Petersson et al.

[11] 4,244,759

[45] Jan. 13, 1981

[54] METHOD OF IMPROVING THE LINEARITY OF A DOUBLE-FACE LATERAL PHOTO DETECTOR FOR POSITION DETERMINING PURPOSES

[75] Inventors: Göran P. Petersson; Lars-Erik Lindholm, both of Gothenburg, Sweden

[73] Assignee: Selcom AB, Partille, Sweden

[21] Appl. No.: 28,645

[22] Filed: Apr. 10, 1979

Related U.S. Application Data

[63] Continuation of Ser. No. 849,938, Nov. 9, 1977, abandoned, which is a continuation of Ser. No. 657,043, Feb. 11, 1976, abandoned.

[51] Int. Cl.³ .................. H01L 21/304; H01L 21/306
[52] U.S. Cl. ........................... 156/649; 29/572; 29/580; 156/656; 156/657; 357/55
[58] Field of Search ............... 156/648, 649, 656, 657; 29/572, 580; 357/55; 250/370

[56] References Cited

U.S. PATENT DOCUMENTS

| | | | |
|---|---|---|---|
| 3,113,220 | 12/1963 | Goulding et al. | 357/55 |
| 3,527,944 | 9/1970 | Kraner | 250/370 |
| 3,890,178 | 6/1975 | Lebailly | 156/648 |
| 4,055,765 | 10/1977 | Gerber et al. | 357/55 |
| 4,056,726 | 11/1977 | Harchol | 357/55 |

*Primary Examiner*—Jerome W. Massie
*Attorney, Agent, or Firm*—Harness, Dickey & Pierce

[57] ABSTRACT

A method of improving the linearity of a photo detector of the kind comprising a semiconductor wafer, two resistive layers, each one covering one side of said wafer, a p-n junction separating said two layers, and one pair of electrodes on each resistive layers, each pair of electrodes defining two opposite sides of a right-angled square, whereby two portions of the resistive layers are defined, within said square. Said portions within said square are delimited electrically from the rest of said layers and the p-n junction, for instance by etching, whereby the linearity within this square is increased, and thus the useful area of the detector.

4 Claims, 2 Drawing Figures

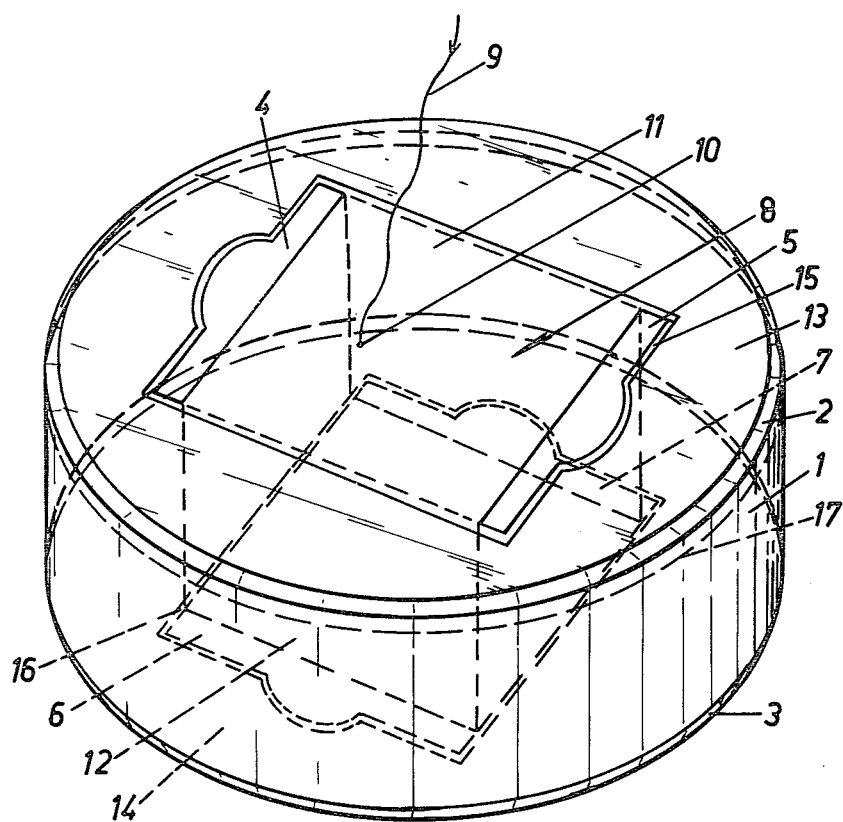

METHOD OF IMPROVING THE LINEARITY OF A DOUBLE-FACE LATERAL PHOTO DETECTOR FOR POSITION DETERMINING PURPOSES

This is a continuation of application Ser. No. 849,938, filed Nov. 9, 1977, now abandoned, which is a continuation of application Ser. No. 657,043, filed Feb. 11, 1976, now abandoned.

BACKGROUND OF THE INVENTION

The present invention concerns a method of improving the linearity of a photo detector of the kind in which electrical signals are used to define the position of a point illuminated on a detector surface included in the detector, said detector comprising a semiconductor plate, two resistive layers each one covering one side of the semiconductor plate, a p-n junction separating the two resistive layers and two pairs of electrodes arranged one at each resistive layer and which electrodes are of such a shape and are so positioned that each one of the two pairs defines two opposite sides of a right-angled square, said square defining two portions of the resistive layers which portions are positioned in opposite and parallel relationship.

Lateral photo detectors of the kind outlined above suffer from the disadvantage that the connection between the output signals and the coordinates relating to the position is non-linear, particularly close to the margin of the detector surface defined by the electrodes. For this reason it has unfortunately hitherto been necessary, in cases where the demand on linearity is strict, to limit oneself to the use of a minor portion of the detector surface positioned symmetrically relative to the centre thereof where the edge effects are not very noticeable. For instance, by giving to the electrodes a particular geometrical configuration, more precisely by allowing their ends to extend across and beyond the electrodes positioned at the opposite side it becomes possible to affect the edge effects to some extent by so to speak displace the margin, but in order to achieve real efficiency in this way the electrodes must be made of such a length that the detector becomes uncomfortably large in relation to the useful detector surface. In addition, the area of the p-n junction and the circumference of the semiconductor plate increases, which gives rise to a non-desirable increase of the leakage current through the p-n junction and over the margin thereof, with subsequent noise increase and of course a necessity for larger amounts of materials.

SUMMARY OF THE INVENTION

With the aid of the present invention the linearity of the detector may be improved quite considerably while at the same time the leakage current is actually reduced. For this purpose the invention is characterised in that the portions of the respective resistive layers and the p-n junction positioned at the margins of and within the right-angled square are delimited electrically from the remaining portions of the layers and the p-n junction. A preferred simple embodiment of the invention is characterised in that the delimitation is effected through etching and in that each etched area extends substantially in a square pattern which closely follows the electrodes and the surfaces defined by said electrodes.

DETAILED DESCRIPTION OF A PREFERRED EMBODIMENT

DETAILED DESCRIPTION OF A PREFERRED EMBODIMENT

Figure 1:
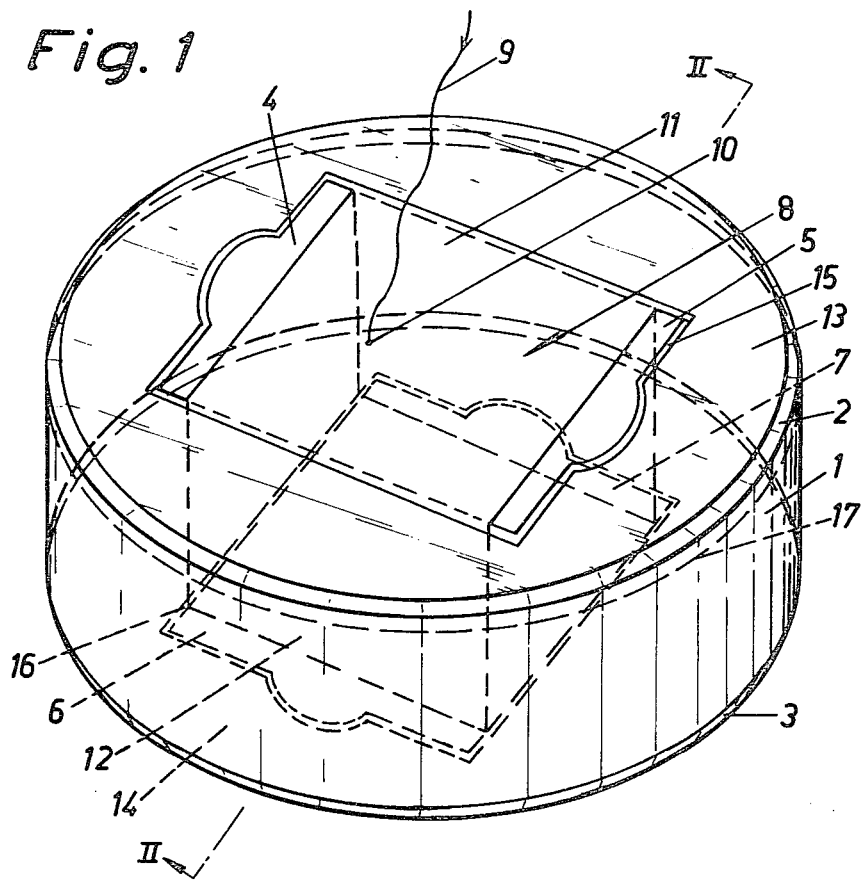
FIG. 1 is a perspective view of one embodiment of a lateral photo detector constructed in accordance with this invention with the detector thickness being exaggerated for clarity of illustration.
Figure 2:
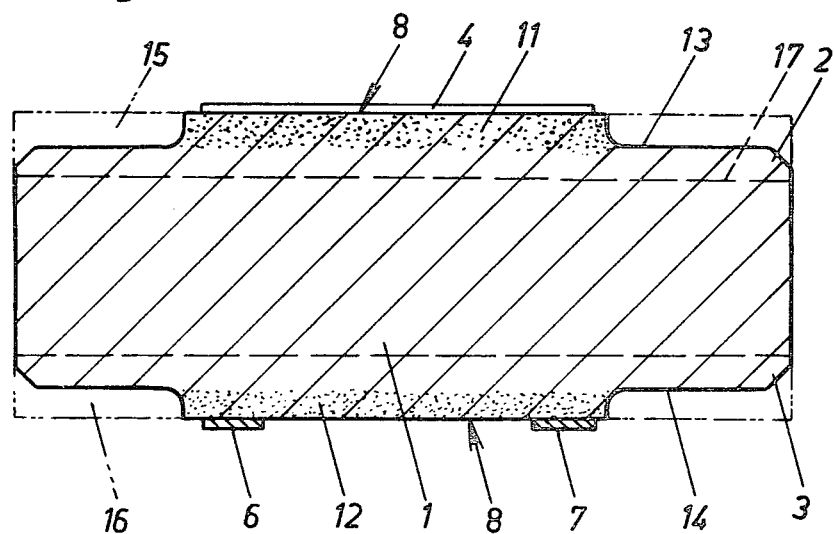
FIG. 2 is a cross-sectional view taken along the line 2—2 of FIG. 1.

As appears from the drawing figure, the detector of the kind to which the present invention is related comprises a semiconductor plate 1 consisting of doped silicon, a so-called wafer. On account of the manufacturing processes used and the difficulties to work the fragile wafers, such semiconductor plates almost without exceptions are in the shape of a circular disc. On each side of the plate 1 is arranged a resistive layer 2 and 3, respectively. The magnitude of the resistivity depends on the application of use but common values are 10–200 ohm.meters. The resistive layers are manufactured through doping and in connection with one of the layers 2 at the "transition" between this layer and the semiconductor plate proper is positioned a p-n junction 17. Each one of the resistive layes 2, 3 is provided with a pair of elongate and parallel electrodes 4, 5, and 6, 7, respectively.

If one disregards the thickness of the semiconductor plate the positions of the electrode pairs may be defined such that opposite sides of one pair of electrodes extend along two opposite sides of a square whereas the opposite sides of the other pair of electrodes extend along the other two sides of the same square this square enclosing the ideally useful detector surface 8. The electrodes 4, 5 and 6, 7, respectively, are connected to one subtractor each (not shown). When a beam of light 9 impinges on the detector surface 8 in point 10, the energy of the beam gives rise to a photocurrent through the p-n junction and as the later is biased in the reverse direction via the electrodes 4, 5, and 6, 7, respectively, the circuit is closed only via the resistive layers 2, 3, the electrode pairs 4, 5, and 6, 7, respectively, and external electronic means (not shown). Depending on where the beam 9 impinges on the detector surface 8 the current is distributed differently on the various electrodes and in this way is obtained a relatively linear indication of the position of the spot of impingement 10 in an imaginary X-and Y-axes direction on the detector.

In order to eliminate non-linear edge effects that normally occur in the kind of the detectors described above, the portions 11, 12 of each layer 2 and 3 that are positioned within the surface defined by the above-mentioned square are delimited in accordance with the present invention from the portions 13, 14 of said layers positioned outside said square, this delimitation being effected by means of etched-through areas 15 and 16 extending across the respective layers 2,3. In the layer 2 adjacent the p-n junction 17 the etching is performed to a depth ensuring that the etched area passes also through the p-n junction. The improved linearity thus is obtained by preventing the current from flowing through the portions 13, 14 of the resistive layers 2, 3 that are positioned outside the ideal detector surface 8, defined by the above-mentioned square.

Each etched area 15, 16 which preferably is of this so-called MESA type, extends essentially between the ends of the opposed pair of electrodes and outside the electrodes in a closed "ring", preferably not in absolute contact with the electrodes. As the detector surface 8, circumscribed by the electrodes 4, 5 and 6, 7 is insulated from the remaining portions 13, 14 of the resistive layers as a result of the etching, the electrical field image of the detector surface 8 obtains a markedly improved linearity as compared with prior-art detectors of this kind, with the result that the connection between the output signals from the detector and the position of the point of impingement 10 of the incoming beam of light 9 on the detector surface shows extremely good linearity. Furthermore is reduced the area through which the leakage current may flow through the p-n junction, which reduces the total leakage current through the detector. The edge effects at the margin of the detector are likewise reduced in this manner without the provision of any additional measures.

The invention is not limited to the embodiment as described and illustrated in the aforegoing but various modifications are possible within the scope of the appended claims. For instance, the etching may be effected in such a manner that the entire portions of the resistive layers 2, 3 and the p-n junction 17 positioned outside the detector surface are etched away. The delimitation may also be done by mechanical means, e.g. through blasting. The invention is of course also applicable to detectors of similar type made in other materials. In detectors which are etched at the margin to lessen the leakage current etched areas in accordance with the present invention may replace such marginal etching.

What we claim is:

1. In a method of making a photo detector of the semiconductor type using electrical signals from pairs of electrodes to sense the position of an illuminated spot on a detector surface of said detector and having improved linearity comprising forming a semiconductor plate base layer, adding two doped conducting layers each one of which covers a respective opposite side of said base layer, positioning a p-n junction between said two doped conducting layers, and providing two pairs of electrodes, each of said pairs being arranged on a respective one of the doped conducting layers, said electrode pairs being shaped and positioned so that the pairs of electrodes define the boundary of a parallelpiped, said parallelpiped encompassing respective portions of each of said doped conducting layers, and so that one pair of electrodes lie on the opposite side of the square of the parallelpiped lying on the surface a conductive layer and the other pair of electrodes lie on the opposite side of the square of the parallelpiped lying on the surface of the other conductive layer such that the pairs of electrodes are normal to each other in the plane of the surface of the photodetector, the improvement comprises electrically isolating the portions of the respective doped conducting layers and the p-n junction positioned within said squares of the parallelpiped by removing the entire portion of said doped conducting layers and said junction surrounding said electrodes and surrounding the squares of the parallelpiped lying on the surface of the conductive layers.

2. The method as set forth in claim 1 wherein the removed portions extend essentially in a square configuration closely following the electrodes and the surface defined by the electrodes.

3. The method as set forth in claim 2 wherein the removal is accomplished by etching.

4. The method as set forth in claim 1 wherein the removal is accomplished by blasting.

* * * * *